US012651817B2

(12) United States Patent
Nielsen et al.

(10) Patent No.: US 12,651,817 B2
(45) Date of Patent: Jun. 9, 2026

(54) COUPLING RESONATORS WITH WIDELY SEPARATED OVERTONES

(71) Applicant: NORTHROP GRUMMAN SYSTEMS CORPORATION, Falls Church, VA (US)

(72) Inventors: Max E. Nielsen, Riverton, UT (US); Anthony Joseph Przybysz, Linthicum, MD (US); Jennifer Lund, Linthicum, MD (US); Jose M. Acevedo, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 280 days.

(21) Appl. No.: 18/652,221

(22) Filed: May 1, 2024

(65) Prior Publication Data

US 2026/0081337 A1     Mar. 19, 2026

(51) Int. Cl.
*H01P 7/00*          (2006.01)
*H03H 7/00*          (2006.01)

(52) U.S. Cl.
CPC ................. *H01P 7/00* (2013.01); *H03H 7/00* (2013.01)

(58) Field of Classification Search
CPC ................................... H01P 7/00; H03H 7/00
See application file for complete search history.

(56) References Cited

U.S. PATENT DOCUMENTS

| | | | | |
|---|---|---|---|---|
| 9,893,262 | B2 * | 2/2018 | Thompson | ........... H03H 7/0115 |
| 10,867,747 | B2 * | 12/2020 | Yosui | ........................ H01F 1/34 |
| 10,884,450 | B2 * | 1/2021 | Strong | ..................... G06F 1/10 |

(Continued)

FOREIGN PATENT DOCUMENTS

| | | |
|---|---|---|
| CN | 102195109 A | 9/2011 |
| EP | 0472087 A2 | 2/1992 |

(Continued)

OTHER PUBLICATIONS

Alex (Wilhelm Raceworks, LLC): "Drone Reduction", found on the internet Apr. 17, 2024 at https://wilhelmraceworks.com/blog/drone-reduction.

(Continued)

*Primary Examiner* — Andrea Lindgren Baltzell
*Assistant Examiner* — Alan Wong
(74) *Attorney, Agent, or Firm* — Tarolli, Sundheim, Covell & Tummino LLP

(57)          ABSTRACT

A coupling resonator circuit includes a capacitive portion that includes a capacitive plate having a geometrical shape; and an inductive portion that is coupled to the capacitive portion. The inductive portion includes a transmission line having a first end and a second end, and the transmission line tapers from the first end in the direction of the second end such that a width of the transmission line at the first end is greater than a width of the transmission line at the second end. The coupling resonator circuit is configured to resonate at a desired coupling frequency; and dimensions of the capacitive portion and the inductive portion determines a separation in frequency between the desired coupling frequency and one or more resonant frequencies that are nearest to the desired coupling frequency.

20 Claims, 13 Drawing Sheets

(56)  References Cited

U.S. PATENT DOCUMENTS

| | | |
|---|---|---|
| 2005/0140473 A1 | 6/2005 | Jun et al. |
| 2005/0206481 A1 | 9/2005 | Koizumi et al. |

FOREIGN PATENT DOCUMENTS

| | | | |
|---|---|---|---|
| KR | 10-1007544 B1 | 1/2011 | |
| WO | WO-2016207600 A1 * | 12/2016 | ............. H03H 7/383 |

OTHER PUBLICATIONS

Wikipedia: "Helmholtz resonance"; found on the internet on Apr. 17, 2024 at https://en.wikipedia.org/wiki/Helmholtz_resonance.

WOISR "Notification of Transmittal of the International Search Report and the Written Opinion of the International Searching Authority, or the Declaration" mailed on Jun. 4, 2025 for corresponding PCT/US2025/016750.

* cited by examiner

COUPLING RESONATORS WITH WIDELY SEPARATED OVERTONES

GOVERNMENT INTEREST

The invention was made under Government Contract. Therefore, the US Government has rights to the invention as specified in that contract.

TECHNICAL FIELD

This disclosure relates generally to superconducting systems, and specifically to coupling resonator circuits that facilitates communication between superconducting resonator devices superconducting resonator devices.

BACKGROUND

Superconducting resonator devices are basic building blocks utilized in quantum computing systems. Superconducting resonator devices can generate and respond to a wide range of frequencies, only some of which contain useful information. Coupling among superconducting resonator devices needs to be strong at frequencies carrying useful information while also suppressing coupling at frequencies not carrying useful information. Simple transmission lines are typically utilized to couple superconducting resonator devices. Simple transmission lines, however, have multiple resonant frequencies and therefore, will typically transfer information not only at some resonant frequency of interest, but also at other frequencies at which they are resonant. Thus, signals/information at these other unwanted frequencies are also communicated between superconducting resonator devices when they are coupled using simple transmission lines.

SUMMARY

One example of the invention includes a coupling resonator circuit including a capacitive portion that includes a capacitive plate having a geometrical shape; and an inductive portion that is coupled to the capacitive portion. The inductive portion includes a transmission line having a first end and a second end, and the transmission line tapers from the first end in the direction of the second end such that a width of the transmission line at the first end is greater than a width of the transmission line at the second end. The coupling resonator circuit is configured to resonate at a desired coupling frequency; and the dimensions of the capacitive portion and the inductive portion determines a separation in frequency between the desired coupling frequency and one or more resonant frequencies that are nearest to the desired coupling frequency.

Another example of the invention includes a superconducting system including a first superconducting resonator device, a second superconducting resonator device and a coupling resonator circuit coupled between the first superconducting resonator device and the second superconducting resonator device. The coupling resonator circuit includes a capacitive portion that includes a capacitive plate having a geometrical shape; and an inductive portion that is coupled to the capacitive portion, the inductive portion including a transmission line having a first end and a second end. The transmission line tapers from the first end in the direction of the second end such that a width of the transmission line at the first end is greater than a width of the transmission line at the second end. The coupling resonator circuit is configured to resonate at a desired coupling frequency to facilitate communication between the first superconducting resonator device and the second superconducting resonator device. The dimensions of the capacitive portion and the inductive portion determines a separation in frequency between the desired coupling frequency and one or more resonant frequencies that are nearest to the desired coupling frequency.

DETAILED DESCRIPTION

Figure 1:
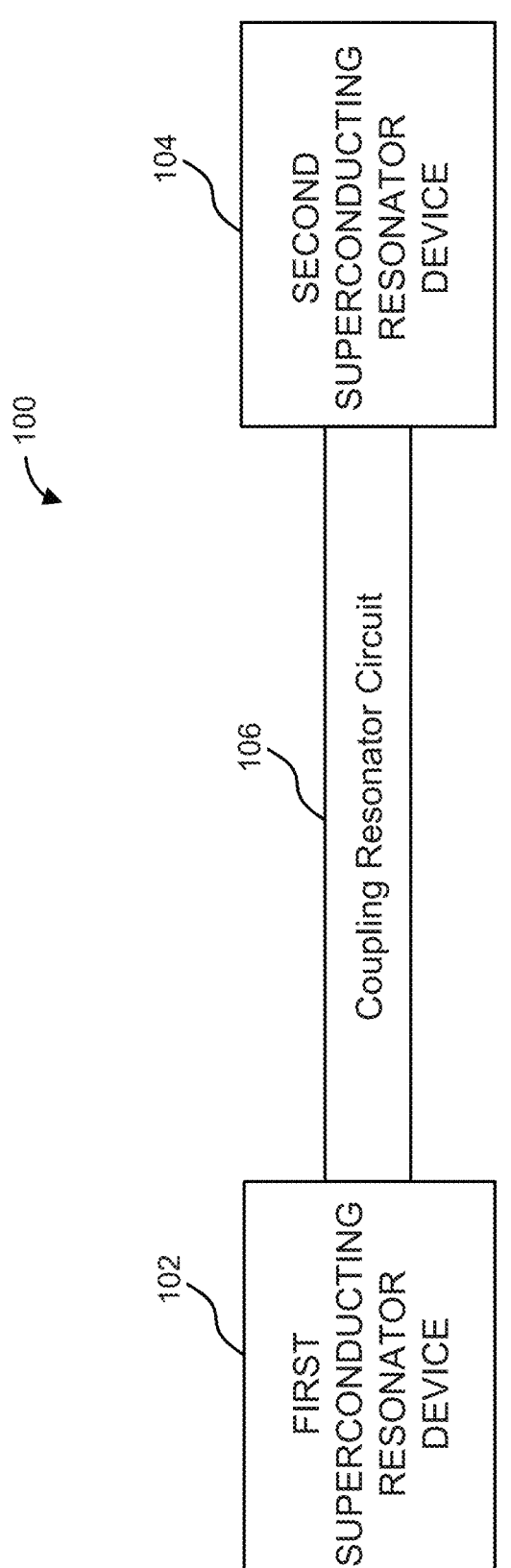
FIG. 1 illustrates an example superconducting system.

This disclosure relates to superconducting systems, and specifically to coupling resonator circuits that facilitates communication between superconducting resonator devices. Superconducting resonator devices can be a superconducting resonator, a qubit, a superconductor quantum interference device (SQUID) or some other superconductor device that resonates with one or more resonant frequencies. Some superconducting resonator devices are formed from one or more components, such as one or more capacitors, inductors, Josephson junctions (JJs), and transmission lines. In some examples, a superconducting resonator device can be a superconductor loop that one or more components, such as one or more capacitors, inductors, Josephson junctions (JJs), and transmission lines. Substrates and enclosures supporting superconducting resonator devices can communicate unwanted signals via unintended paths such as ground planes, sky planes, and box resonances between neighboring superconductor resonator devices. A common and effective method of weakening unwanted paths is to physically separate the superconducting resonator devices by millimeter-scale distances, and couple them to each other using transmission lines. However, with greater separation, the overtones of simple transmission lines become more closely spaced in frequency, which allows stronger coupling of noise or spurious information at those overtones. For example, a simple transmission line having quarter-wave peak resonance at 5 GHz will have a third-order peak at 15 GHz, only a factor of 3 away in frequency.

To overcome the above disadvantages of utilizing simple transmission lines to couple superconducting resonator devices, a coupling resonator circuit is disclosed herein. The coupling resonator circuit disclosed herein is utilized to facilitate communication between superconducting resonator devices. The coupling resonator circuit includes a capacitive portion that includes a capacitive plate having a geometrical shape and an inductive portion that is coupled to the capacitive portion. The inductive portion includes a transmission line having a first end and a second end, and the transmission line tapers from the first end in the direction of the second end such that a width of the transmission line at the first end is greater than a width of the transmission line at the second end. The coupling resonator circuit is configured to resonate at a desired coupling frequency. In some examples, the dimensions of the capacitive portion and the inductive portion determines a separation in frequency between the desired coupling frequency and one or more resonant frequencies that are nearest to the desired coupling frequency. In some examples, the desired coupling frequency includes a fundamental frequency.

The proposed coupling resonator circuit, because of their size and shape, provide a resonance at a desired coupling frequency, and also limit coupling at frequencies below and above the desired coupling frequency. More particularly, the proposed coupling resonator circuit facilitates to communicate signals between/among superconducting resonator devices at their desired coupling frequency. Further, the coupling resonator circuit facilitates to have nearby peak resonances (e.g., higher-order peak resonances) well separated from their desired coupling frequency, thereby excluding or suppressing communication at those unwanted frequencies. Furthermore, the coupling resonator circuit facilitates to have minimal responses to frequencies below their fundamental frequency, thereby preventing response or communication of information at frequencies below the fundamental. In addition, the coupling resonator circuit have large physical size, to provide large separation between/among superconducting resonator devices, thereby reducing the likelihood of communicating information between the superconducting resonator devices except through the coupling resonator circuit.

FIG. 1 illustrates an example superconducting system 100. The superconducting system 100 may be implemented as part of any larger superconducting system. The superconducting system 100 includes a first superconducting resonator device 102 and a second superconducting resonator device 104. The superconducting system 100 further includes a coupling resonator circuit 106 that couples the first superconducting resonator device 102 and the second superconducting resonator device 104. In particular, the coupling of the first superconducting resonator device 102 and the second superconducting resonator device 104 by the coupling resonator circuit 106 can facilitate communication of information between the first superconducting resonator device 102 and the second superconducting resonator device 104.

The coupling resonator circuit 106 includes a capacitive portion (not shown) and an inductive portion (not shown) that are coupled to one another. The capacitive portion may include a capacitive plate having a geometric shape. Further, the inductive portion may include a transmission line having a first end and a second end, and the transmission line tapers from the first end in the direction (or towards the direction)

of the second end such that a width of the transmission line at the first end is greater than a width of the transmission line at the second end. In some examples, the transmission line tapers continuously from the first end to the second end. Alternately, in other examples, the transmission line includes a tapered portion that extends from the first end to an intermediate point of the transmission line and a regular portion that extends from the intermediate point of the transmission line to the second end. In such examples, the transmission line tapers continuously from the first end to the intermediate point in the tapered portion and the transmission line has a uniform width from the intermediate point to the second end in the regular portion.

In some examples, the transmission line is tapered in an exponential manner. Alternately, in other examples, the transmission line is tapered in accordance with a gaussian shape. While the exponential taper is mathematically simple, once the length of the inductive portion is specified, the exponential taper rate is fixed. However, while using Gaussian taper, the length of the taper can be set independently irrespective of the Gaussian width and height parameters. In some examples, an area of the capacitive portion (e.g., the capacitive plate) of the coupling resonator circuit 106 is greater than an area of the inductive portion (e.g., the transmission line) of the coupling resonator circuit 106. In some examples, the capacitive plate and/or the transmission line may include perforations on their corresponding surfaces. In some examples, the perforations include posts that serve to anchor the capacitive plate and the transmission line to the ground planes above and below the coupling resonator circuit 106, and also enables to further confine fields and currents within the coupling resonator circuit 106.

In some examples, the capacitive portion and the inductive portion of the coupling resonator circuit 106 are coupled to one another based on coupling the first end (e.g., the end having the greater width) of the transmission line (associated with the inductive portion) to the capacitive plate (associated with the capacitive portion). Alternately, in other examples, the capacitive portion and the inductive portion of the coupling resonator circuit 106 are coupled to one another based on coupling the second end (e.g., the end having the lesser width) of the transmission line (associated with the inductive portion) to the capacitive plate (associated with the capacitive portion). In some examples, the capacitive plate (associated with the capacitive portion) includes one or more capacitive ports configured to couple to one or more superconducting resonator devices, respectively, via capacitive coupling. In some examples, the capacitive portion further includes one or more coupling capacitors configured to couple the one or more superconducting resonator devices respectively to the one or more capacitive ports. Further, the transmission line (associated with the inductive portion) includes one or more inductive ports configured to couple to one or more superconducting resonator devices, respectively, via galvanic coupling.

In some examples, the coupling resonator circuit 106 further includes via walls surrounding the capacitive portion and the inductive portion. The capacitive portion and the inductive portion can include 2-dimensional structures or 3-dimensional structures. In some examples, the inductive portion of the coupling resonator circuit 106 includes a plurality of inductive portions, each inductive portion of the plurality of inductive portions including a respective transmission line having a corresponding first end and a corresponding second end. The respective transmission line of each of the plurality of inductive portions tapers from the corresponding first end in the direction of the corresponding second end such that a width of the respective transmission line at the corresponding first end is greater than a width of the respective transmission line at the corresponding second end.

In one example, the first superconducting resonator device 102 is coupled to the capacitive portion of the coupling resonator circuit 106 via a capacitive port associated with the capacitive plate and the second superconducting resonator device 104 is coupled to the inductive portion of the coupling resonator circuit 106 via an inductive port associated with the transmission line. Alternately, in another example, both the first superconducting resonator device 102 and the second superconducting resonator device 104 are coupled to the capacitive portion of the coupling resonator circuit 106 via respective capacitive ports associated with the capacitive plate. Further, in some other examples, both the first superconducting resonator device 102 and the second superconducting resonator device 104 are coupled to the inductive portion of the coupling resonator circuit 106 via respective inductive ports associated with the transmission line.

The coupling resonator circuit 106 is configured to resonate at a desired coupling frequency (e.g., 5 GHZ). In some examples, the dimensions (e.g., the length, width, shape etc.) of the capacitive portion and the inductive portion are chosen so as to configure the coupling resonator circuit 106 to resonate at the desired coupling frequency (e.g., 5 GHZ). In some examples, the dimensions of the capacitive portion include an area of the capacitive portion and the dimensions of the inductive portion include a length and a tapering coefficient (e.g., the extend of tapering) of the inductive portion. In some examples, the desired coupling frequency of the coupling resonator circuit 106 is chosen such that only desired information is coupled/communicated between the first superconducting resonator device 102 and the second superconducting resonator device 104. In some examples, the desired coupling frequency includes a fundamental frequency.

Further, the dimensions of the capacitive portion and the inductive portion determines a separation in frequency between the desired coupling frequency of the coupling resonator circuit 106 and one or more resonant frequencies that are nearest to the desired coupling frequency. For example, the dimensions of the capacitive portion and the inductive portion are chosen such that the one or more resonant frequencies that are nearest to the desired coupling frequency are widely separated from the desired coupling frequency. The one or more resonant frequencies that are nearest to the desired coupling frequency may include resonant frequencies that are greater than the desired coupling frequency and/or resonant frequencies that are less than the desired coupling frequency. In the examples where the desired coupling frequency includes the fundamental frequency, the one or more resonant frequencies that are nearest to the desired coupling frequency includes a first overtone frequency. In some examples where the desired coupling frequency includes the fundamental frequency, the dimensions of the capacitive portion and the inductive portion are chosen such that the first overtone frequency is at a frequency of 10 times or higher than the fundamental frequency. In some examples, providing a wide separation between the desired coupling frequency of the coupling resonator circuit 106 and the one or more resonant frequencies nearest to the desired coupling frequency enables to eliminate the coupling of unwanted information between the first superconducting resonator device 102 and the second superconducting resonator device 104.

Figure 2:
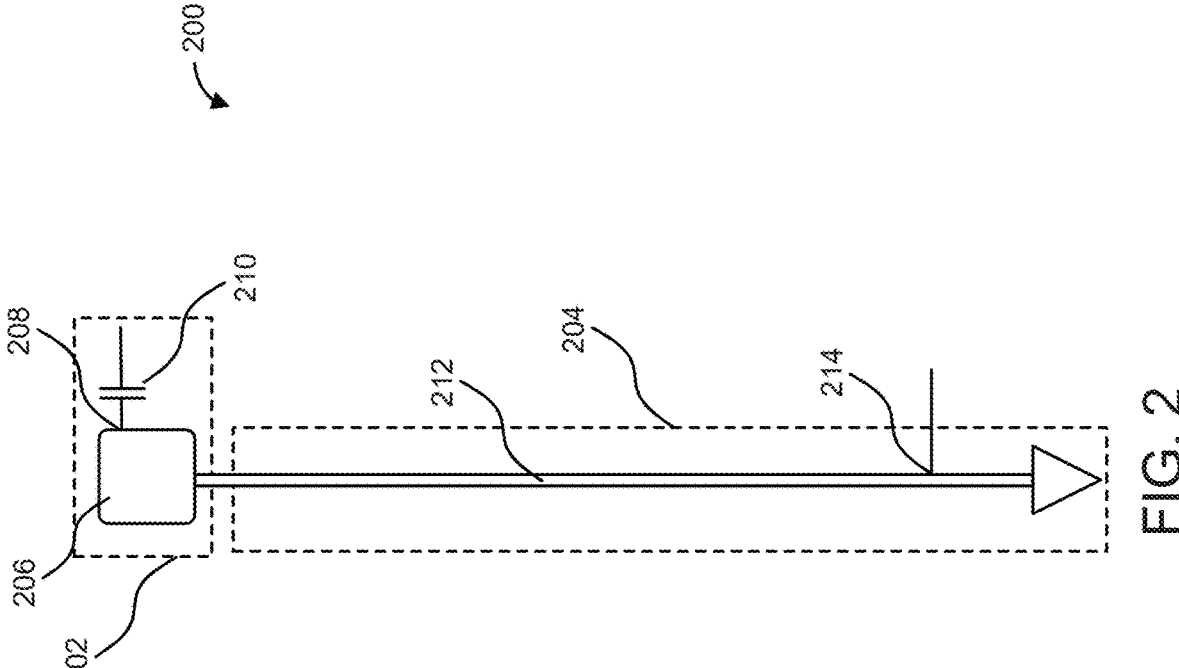
FIG. 2 illustrates an example block diagram of a coupling resonator circuit.

FIG. 2 illustrates an example block diagram of a coupling resonator circuit 200. The coupling resonator circuit 200 may be same as the coupling resonator circuit 106 in FIG. 1. The coupling resonator circuit 200 includes a capacitive portion 202 and an inductive portion 204 that are coupled to one another. In this example, the coupling resonator circuit 200 is shown to include only a single inductive portion 204. However, in other examples, the coupling resonator circuit 200 may include a plurality of inductive portions that are coupled to the capacitive portion 202. The capacitive portion 202 includes a capacitive plate 206 having a geometric shape. In this example, the geometric shape is shown to be a square with rounded edges. However, in other examples, the geometric shape can be different. The capacitive plate 206 includes a capacitive port 208 that is configured to couple to a superconducting resonator device (e.g., the first superconducting resonator device 102 or the second superconducting resonator device 104 in FIG. 1) via capacitive coupling. However, in other examples, the capacitive plate 206 may include more than one capacitive port. The capacitive portion 202 further includes a coupling capacitor 210 configured to couple a superconducting resonator device (e.g., the first superconducting resonator device 102 or the second superconducting resonator device 104 in FIG. 1) to the capacitive port 208. In some examples, one end of the coupling capacitor 210 is coupled to the capacitive port 208 and the other end of the coupling capacitor 210 is coupled to the superconducting resonator device (not shown).

The inductive portion 204 includes a transmission line 212, one end of which is coupled to the capacitive plate 212. The transmission line 212 includes an inductive port 214 that is configured to couple to a superconducting resonator device (e.g., the first superconducting resonator device 102 or the second superconducting resonator device 104 in FIG. 1) via galvanic coupling. In other examples, the transmission line 212 may include more than one inductive port. Although not shown in FIG. 2, the transmission line 212 includes a first end and a second end, and the transmission line 212 tapers from the first end in the direction of the second end such that a width of the transmission line 212 at the first end is greater than a width of the transmission line 212 at the second end. In some examples, the first end of the transmission line 212 is coupled to the capacitive plate 206. Alternately, in other examples, the second end of the transmission line 212 is coupled to the capacitive plate 206. All the other features of the coupling resonator circuit 106 in FIG. 1 are also applicable to the coupling resonator circuit 200 in FIG. 2, and is therefore, not repeated herein.

Figures 3A, 3B:
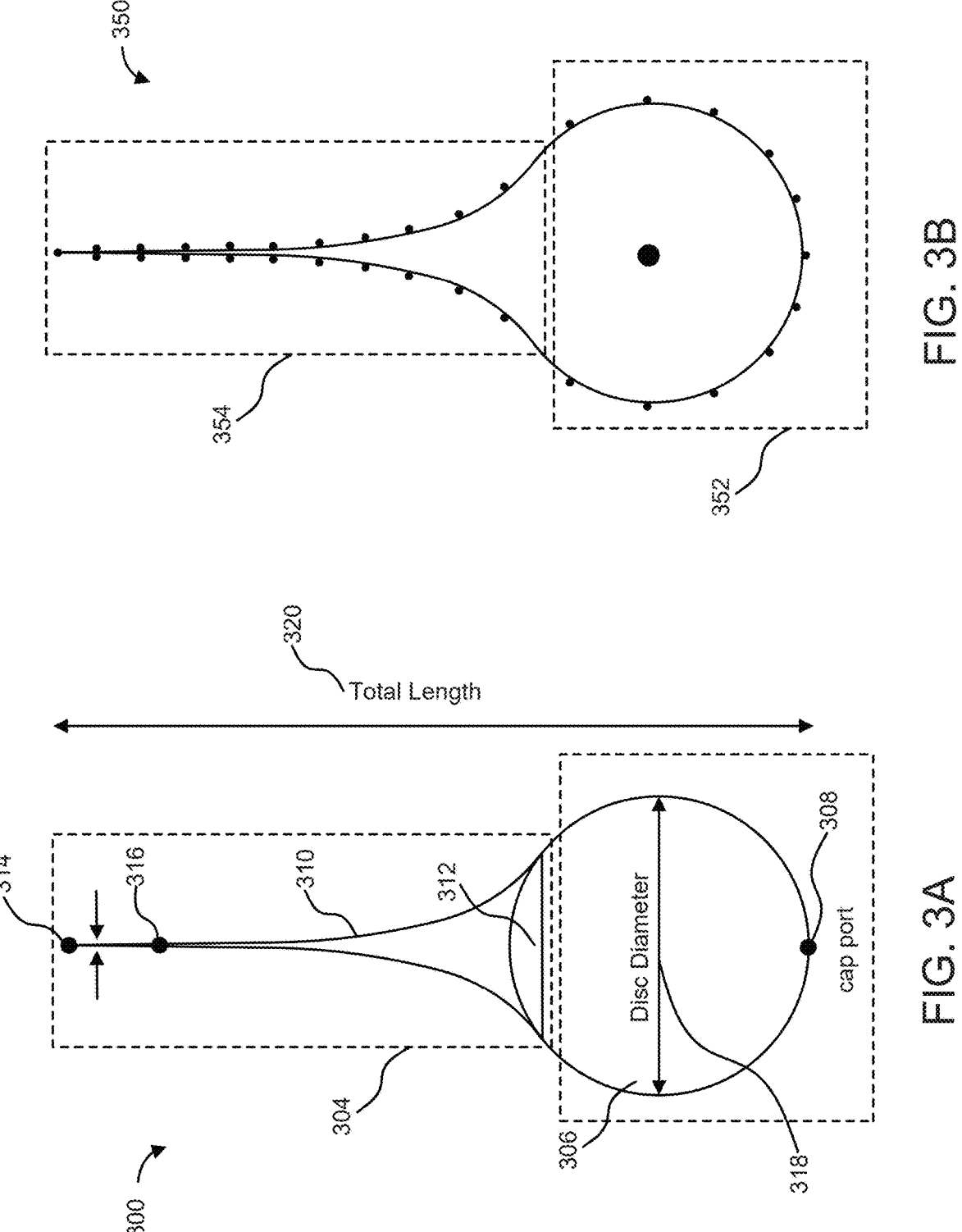
FIG. 3A illustrates an example illustration of a coupling resonator circuit.
FIG. 3B illustrates an example coupling resonator circuit.

FIG. 3A illustrates an example illustration of a coupling resonator circuit 300. In some examples, the coupling resonator circuit 300 includes one possible way of implementation of the coupling resonator circuit 200 in FIG. 2, and therefore all the features of the coupling resonator circuit 200 in FIG. 2 are also applicable to the coupling resonator circuit 300 in FIG. 3A. The coupling resonator circuit 300 includes a capacitive portion 302 and an inductive portion 304 that are coupled to one another. The capacitive portion 302 includes a capacitive plate 306 having a geometric shape (e.g., a general bulb-like shape). The capacitive plate 306 includes a capacitive port 308.

The inductive portion 304 includes a transmission line 310 having a first end 312 and a second end 314. The transmission line 310 tapers from the first end 312 in the direction of the second end 314 such that a width of the transmission line 310 at the first end 312 is greater than a width of the transmission line 310 at the second end 314. The capacitive portion 302 is coupled to the inductive portion 304 by coupling the first end 312 of the transmission line 310 to the capacitive plate 306. The transmission line 310 is tapered from the first end 312 in the direction of the second end 314 in an exponential manner. In other words, the tapering of the transmission line 310 includes an exponential taper. Further, the transmission line 310 tapers continuously from the first end 312 till the second end 314. The transmission line 310 includes an inductive port 316. In this example, the capacitive plate 306 and the transmission line 310 together forms a generally teardrop shape.

The dimensions of the capacitive portion 302 (e.g., the capacitive plate 306) and the inductive portion 304 (e.g., the transmission line 310) are chosen so as to configure the coupling resonator circuit 106 to resonate at a desired coupling frequency. In this example, the desired coupling frequency is the fundamental frequency (e.g., 5 GHZ). Further, the dimensions of the capacitive portion 302 and the inductive portion 304 are chosen such that one or more resonant frequencies of the coupling resonator circuit 300 that are nearest to the desired coupling frequency are widely separated from the desired coupling frequency. In particular, in this example, the dimensions of the capacitive portion 302 and the inductive portion 304 are chosen such that a first overtone frequency of the coupling resonator circuit 300 is widely separated from the fundamental frequency. In this example, the dimensions of the capacitive portion 302 and the inductive portion 304 are chosen based on an aspect ratio that is set to a certain value (e.g., 0.5). The aspect ratio in this example is given as:

$$\text{Aspect Ratio} = \frac{\text{Disc Diameter}}{\text{Total Length}} \tag{1}$$

Where the disc diameter is the disc diameter 318 which is the diameter of the capacitive plate 306 and the total length is the total length 320.

FIG. 3B illustrates an example coupling resonator circuit 350. The coupling resonator circuit 350 is an implementation of the coupling resonator circuit 300 in FIG. 3A. The coupling resonator circuit 350 includes a capacitive portion 352 and an inductive portion 354 that are coupled to one another. All the features of the coupling resonator circuit 300 are also applicable to the coupling resonator circuit 350 in FIG. 3A and is therefore not repeated herein.

Figure 3C:
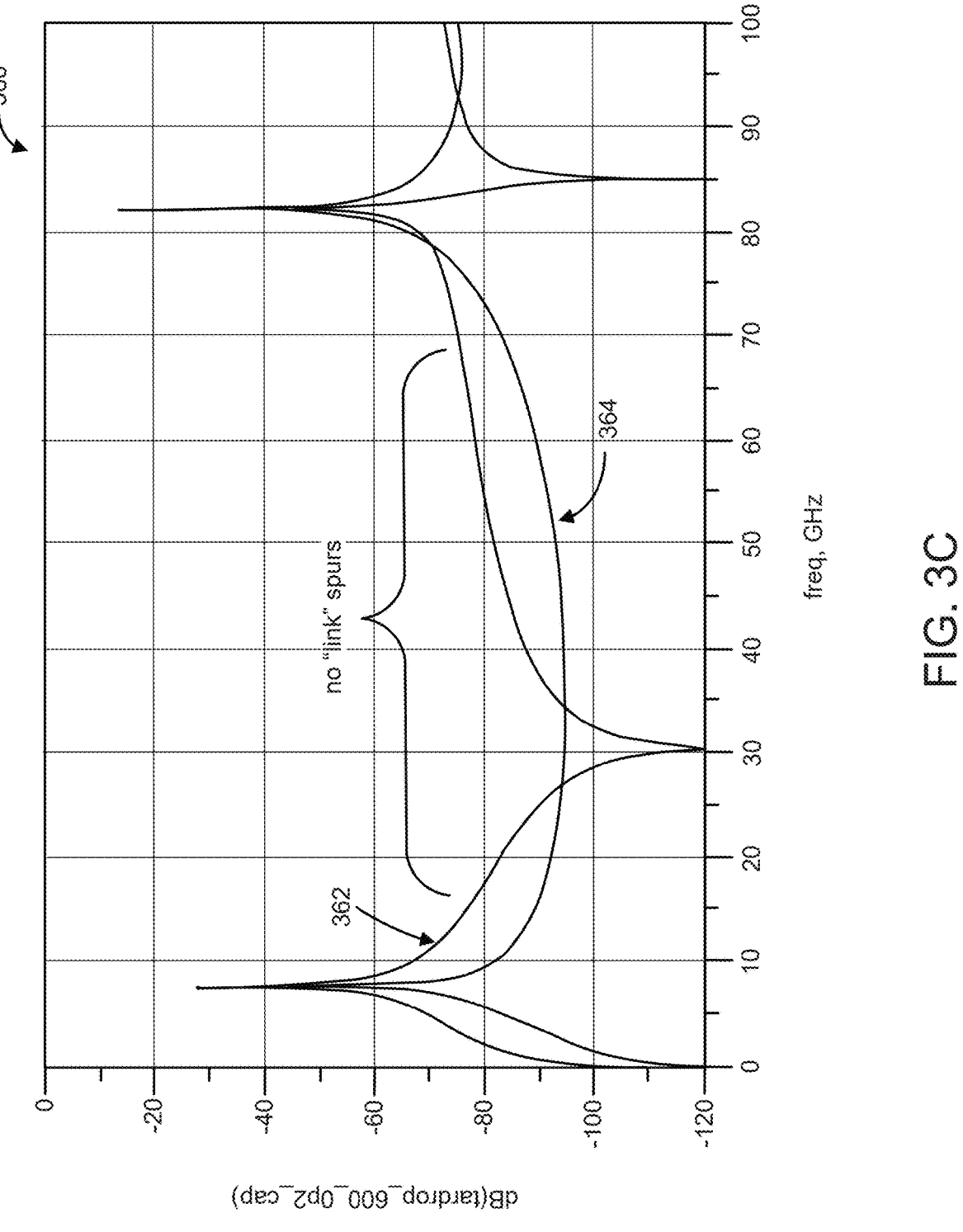
FIG. 3C illustrates a graphical representation that depicts the frequency response of the coupling resonator circuit in FIG. 3A.

FIG. 3C illustrates a graphical representation 360 that depicts the frequency response of the coupling resonator circuit 300 in FIG. 3A. The plot 362 depicts the frequency response of the coupling resonator circuit 300 when measured at the capacitive port 308 associated with the capacitive portion 302. The plot 364 depicts the frequency response of the coupling resonator circuit 300 when measured at the inductive port 316 associated with the inductive portion 304. As can be seen from the plots 362 and 364, the coupling resonator circuit 300 has wide separation in frequency between the fundamental frequency (e.g., at 5 GHz) and a first overtone frequency (e.g., at around 85 GHZ).

Figure 4:
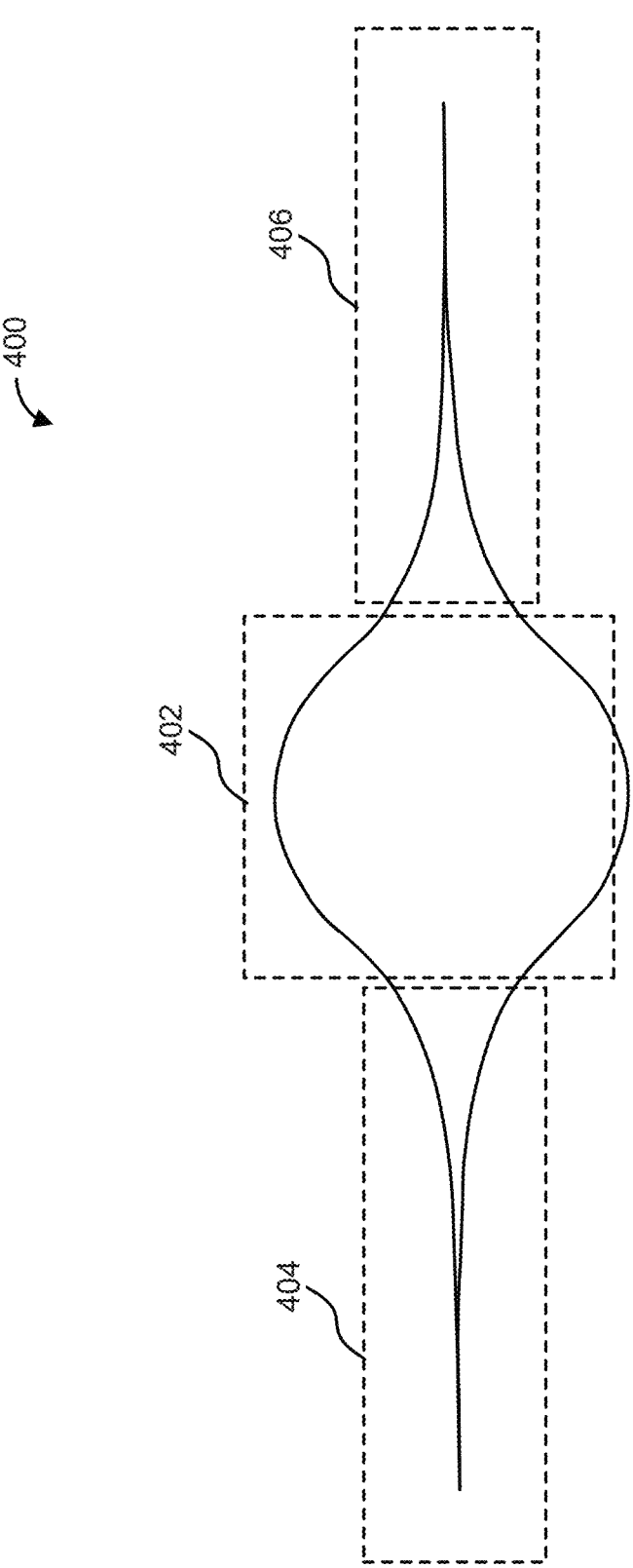
FIG. 4 illustrates an example illustration of a coupling resonator circuit having a plurality of inductive portions.

FIG. 4 illustrates an example illustration of a coupling resonator circuit 400 having a plurality of inductive portions. In some examples, the coupling resonator circuit 400 includes another possible way of implementation of the coupling resonator circuit 200 in FIG. 2. The coupling resonator circuit 400 includes a capacitive portion 402, a first inductive portion 404 and a second inductive portion 406. The first inductive portion 404 and the second inductive portion 406 are coupled to the capacitive portion 402. In this example, the capacitive portion 402 includes a capacitive plate having a generally disc-like shape. The capacitive portion 402 has features similar to the capacitive portion 202 in FIG. 2. Similarly, the first inductive portion 404 and the second inductive portion 406 have features similar to the inductive portion 204 in FIG. 2.

Figure 5:
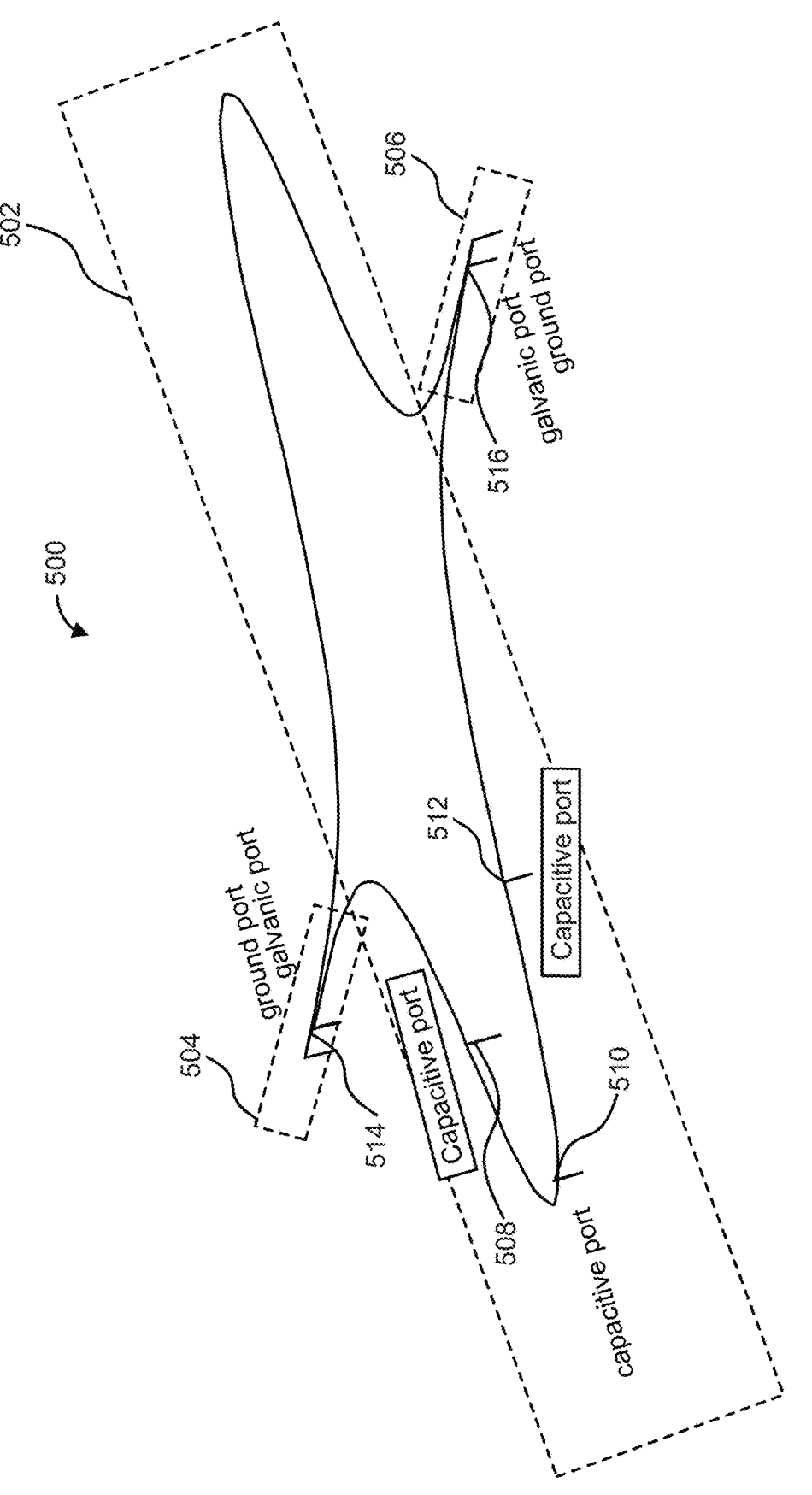
FIG. 5 illustrates an example coupling resonator circuit having multiple inductive ports and multiple capacitive ports.

FIG. 5 illustrates an example coupling resonator circuit 500 having multiple inductive ports and multiple capacitive ports. In some examples, the coupling resonator circuit 500 may be same as the coupling resonator circuit 400 in FIG. 4. The coupling resonator circuit 500 includes a capacitive portion 502, a first inductive portion 504 and a second inductive portion 506. The first inductive portion 504 and the second inductive portion 506 are coupled to the capacitive portion 502. The capacitive portion 502 includes a first capacitive port 508, a second capacitive port 510 and a third capacitive port 512. The first inductive portion 506 includes a first inductive (or galvanic) port 514 and the second inductive portion 506 includes a second inductive (or galvanic) port 516.

Figure 6:
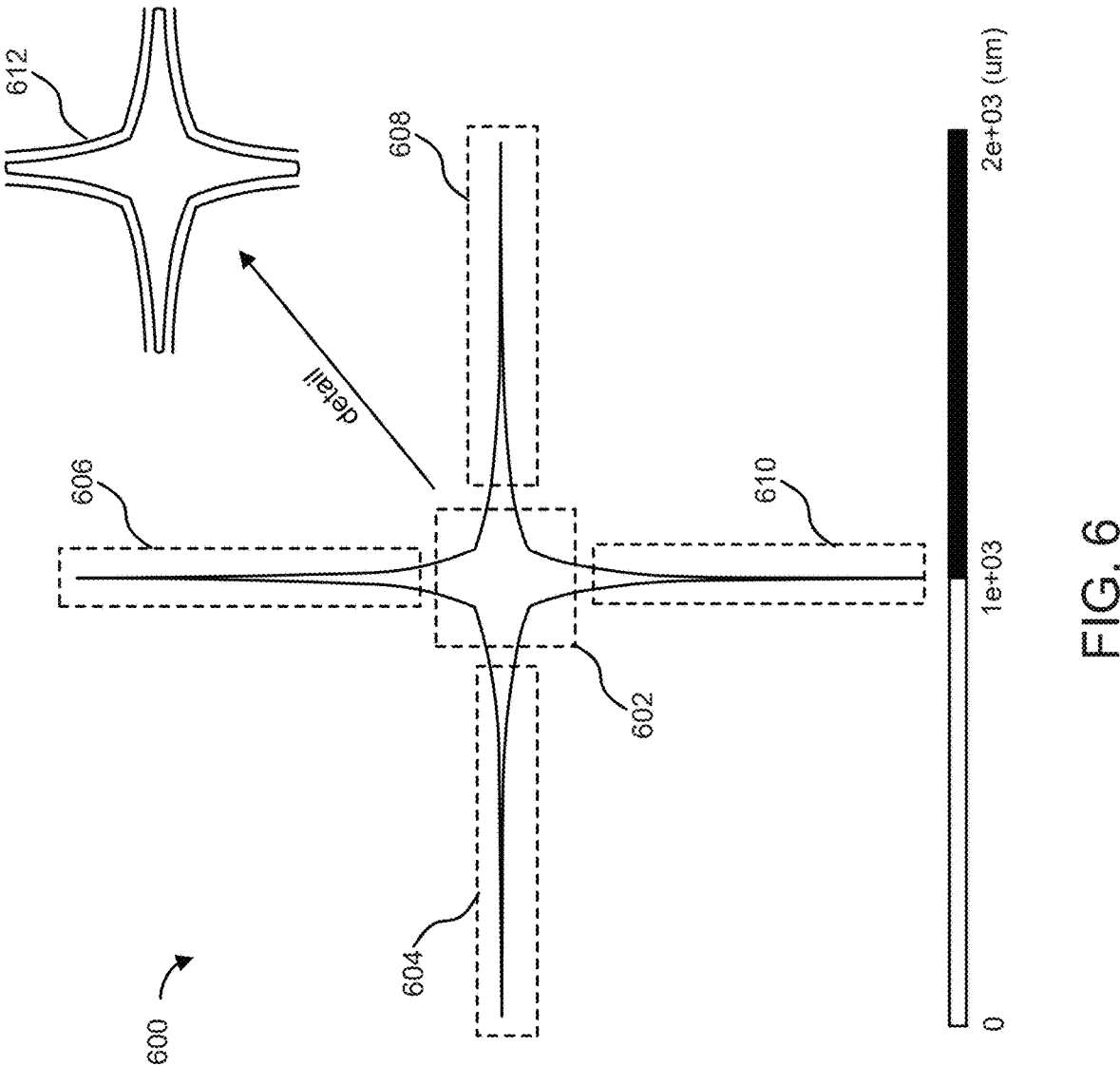
FIG. 6 illustrates an example coupling resonator circuit having via walls.

FIG. 6 illustrates an example coupling resonator circuit 600 having via walls. In some examples, the coupling resonator circuit 600 includes another possible way of implementation of the coupling resonator circuit 200 in FIG. 2. The coupling resonator circuit 600 includes a capacitive portion 602, a first inductive portion 604, a second inductive portion 606, a third inductive portion 608 and a fourth inductive portion 610. The first inductive portion 604, the second inductive portion 606, the third inductive portion 608 and the fourth inductive portion 610 are coupled to the capacitive portion 602. In this example, the capacitive portion 602 includes a capacitive plate having a four-pointed star-like shape. The coupling resonator circuit 600 includes via walls 612 surrounding the capacitive portion 602, the first inductive portion 604, the second inductive portion 606, the third inductive portion 608 and the fourth inductive portion. In some examples, the via walls 612 confine the fields to the coupling resonator circuit 600. In the absence of via walls 612, the coupling resonator circuit 600 may lose energy to its surroundings, which reduces the quality factor Q of the coupling resonator circuit 600, which in turn results in unwanted additional modes to be present in the frequency response of the coupling resonator circuit 600. The via walls 612 are arranged relatively close to the capacitive portion and the inductive portions, within a few dielectric thicknesses, otherwise additional parasitic modes will be present in the frequency response of the coupling resonator circuit 600.

Figure 7:
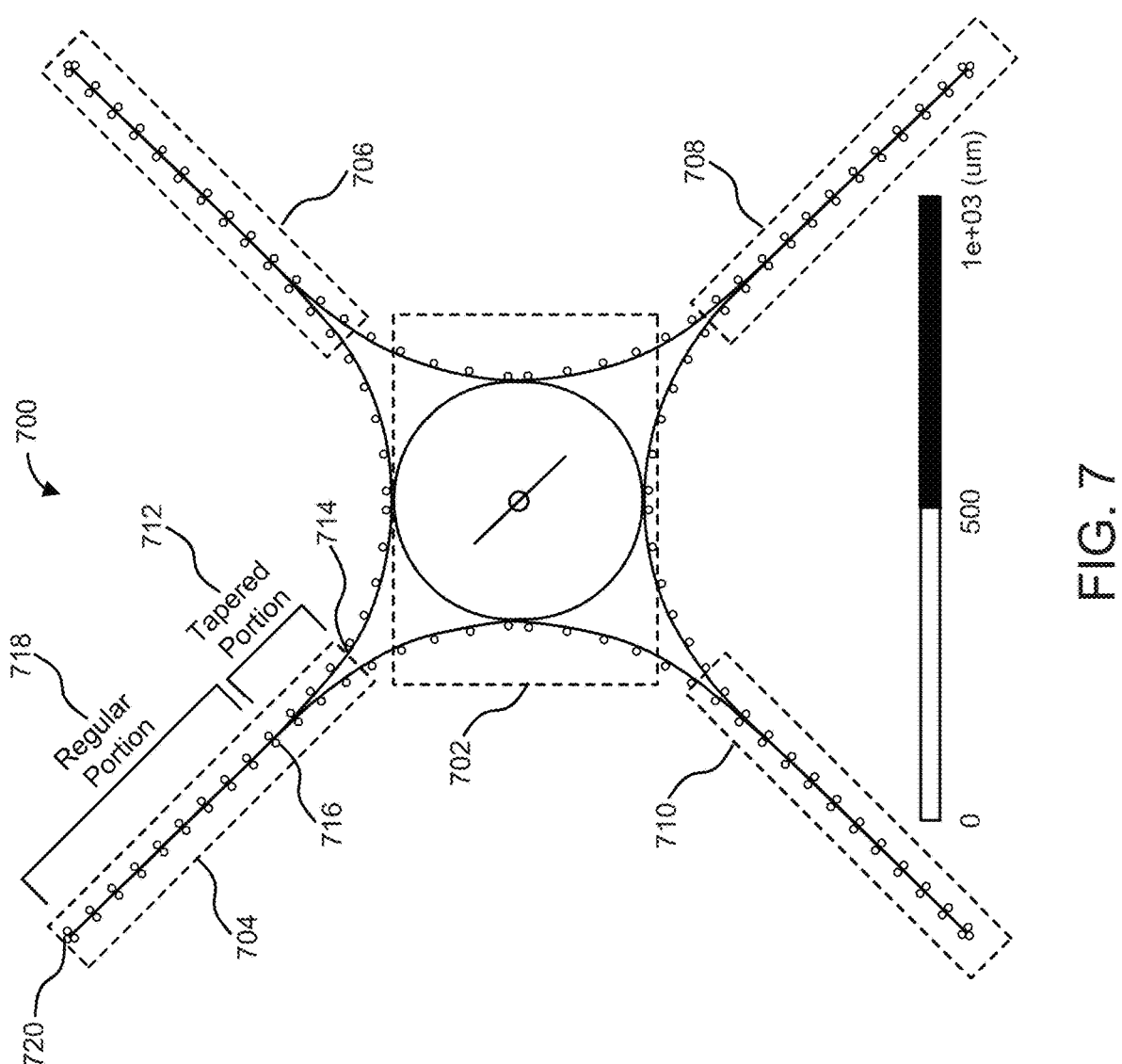
FIG. 7 illustrates an example coupling resonator circuit having a Gaussian taper.

FIG. 7 illustrates an example coupling resonator circuit 700 having a Gaussian taper. In some examples, the coupling resonator circuit 700 includes another possible way of implementation of the coupling resonator circuit 200 in FIG. 2. The coupling resonator circuit 700 includes a capacitive portion 702, a first inductive portion 704, a second inductive portion 706, a third inductive portion 708 and a fourth inductive portion 710. In this example, the capacitive portion 702 includes a capacitive plate having a four-pointed star-like shape. The first inductive portion 704, the second inductive portion 706, the third inductive portion 708 and the fourth inductive portion 710 are coupled to the capacitive portion 702. Each of the first inductive portion 704, the second inductive portion 706, the third inductive portion 708 and the fourth inductive portion 710 has a corresponding transmission line having a first end (e.g., the end that is wider) and a second end (e.g., the end that is narrower), and each of the first inductive portion 704, the second inductive portion 706, the third inductive portion 708 and the fourth inductive portion 710 are coupled to the capacitive portion 702 via their corresponding first end.

Further, each of the first inductive portion 704, the second inductive portion 706, the third inductive portion 708 and the fourth inductive portion 710 has a tapered portion that extends from the first end to an intermediate point of the corresponding transmission line and a regular portion that extends from the intermediate point of the corresponding transmission line to the second end. For example, the first inductive portion 704 has a tapered portion 712 that extends from the first end 714 to the intermediate point 716 where the corresponding transmission line tapers continuously from the first end 714 to the intermediate point 716. In this example, the tapered portion associated with each of the first inductive portion 704, the second inductive portion 706, the third inductive portion 708 and the fourth inductive portion 710 includes a Gaussian taper. Further, the first inductive portion 704 has a regular portion 718 that extends from the intermediate point 716 to the second end 720 where the corresponding transmission line has a uniform width from the intermediate point 716 to the second end 720.

Figure 8:
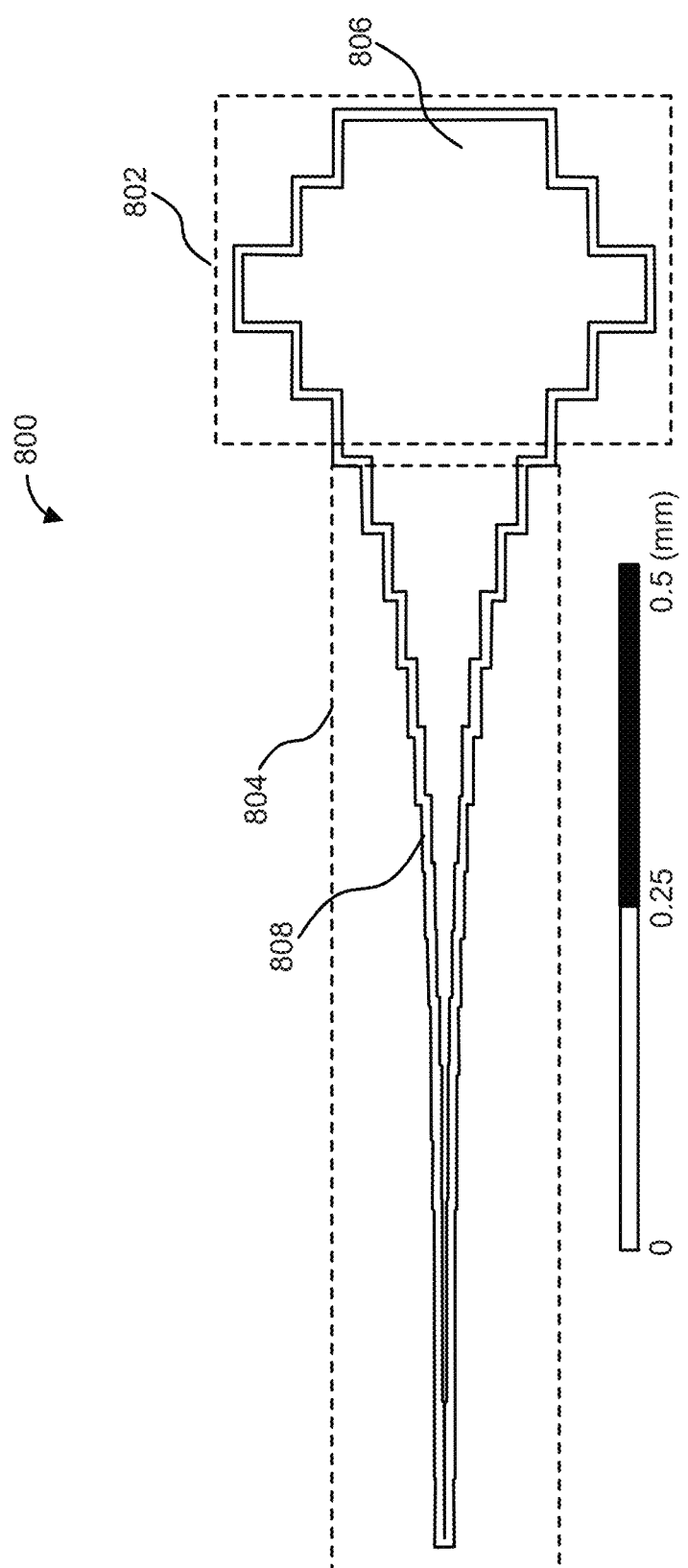
FIG. 8 illustrates an example coupling resonator circuit having stepped edges.
Figure 9:
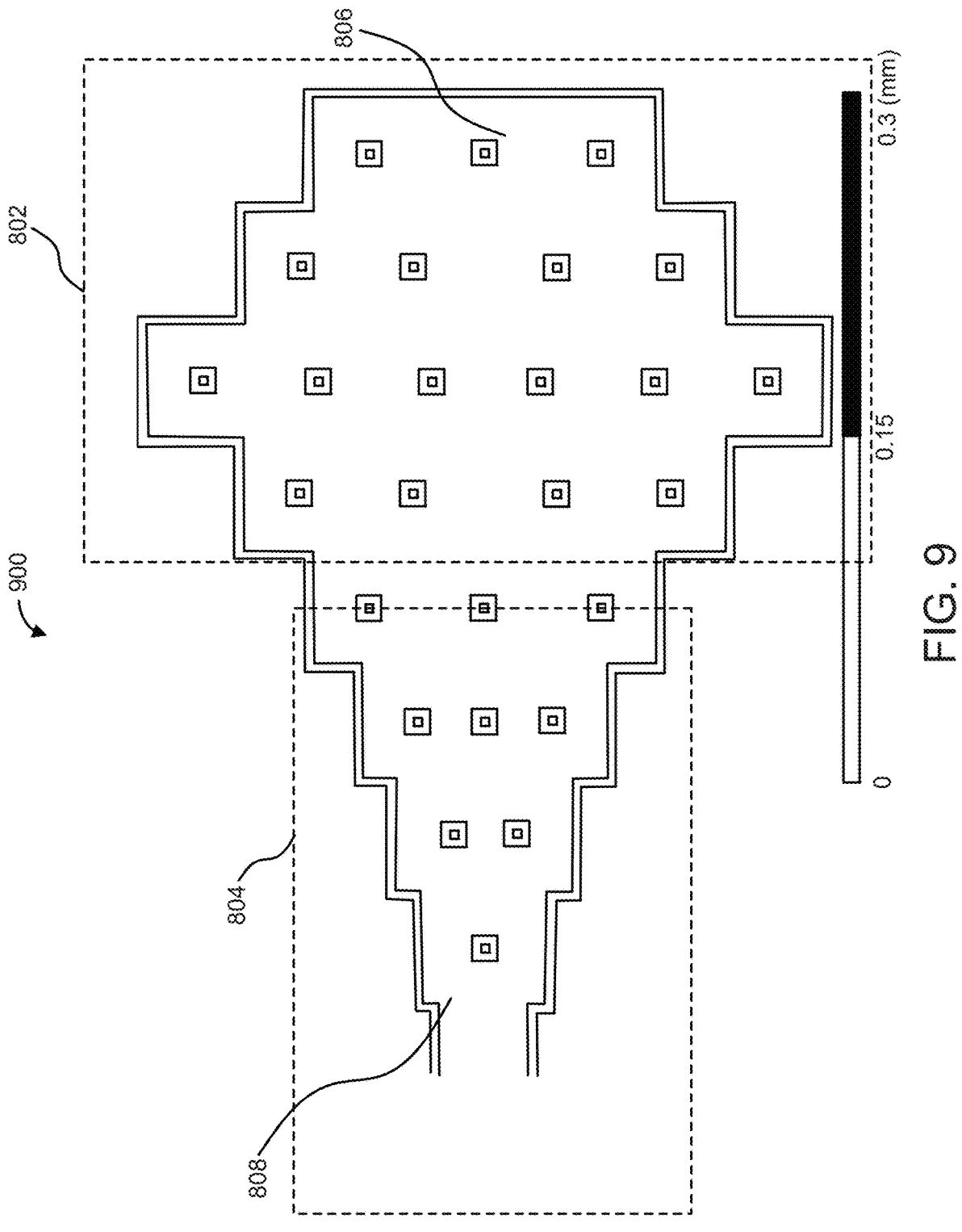
FIG. 9 illustrates an example coupling resonator circuit that includes perforations on the surface.

FIG. 8 illustrates an example coupling resonator circuit 800 having stepped edges. In some examples, the coupling resonator circuit 800 includes another possible way of implementation of the coupling resonator circuit 200 in FIG. 2. The coupling resonator circuit 800 includes a capacitive portion 802 and an inductive portion 804. The capacitive portion 802 includes a capacitive plate 806 having a geometric shape (e.g., a generally square shape) with stepped edges. Further, the inductive portion 804 includes a transmission line 808 with stepped edges. In addition, the capacitive plate 806 and the transmission line 808 may include perforations as illustrated in FIG. 9. FIG. 9 illustrates an example coupling resonator circuit 900 that includes perforations on the surface. The coupling resonator circuit 900 in FIG. 9 is same as the coupling resonator circuit 800 in FIG. 8 and therefore, the same numbering is used to depict the same structure. In FIG. 9, the capacitive plate 806 includes a perforated capacitive plate 806 including a plurality of perforations on its surface. Similarly, the transmission line 808 includes a perforated transmission line 808 including a plurality of perforations on its surface. Further, it is noted herein that although in this example, the perforations are shown with reference to a coupling resonator circuit having stepped edges, in other examples, perforations can be provided in other coupling resonator circuits without stepped edges.

Figure 10:
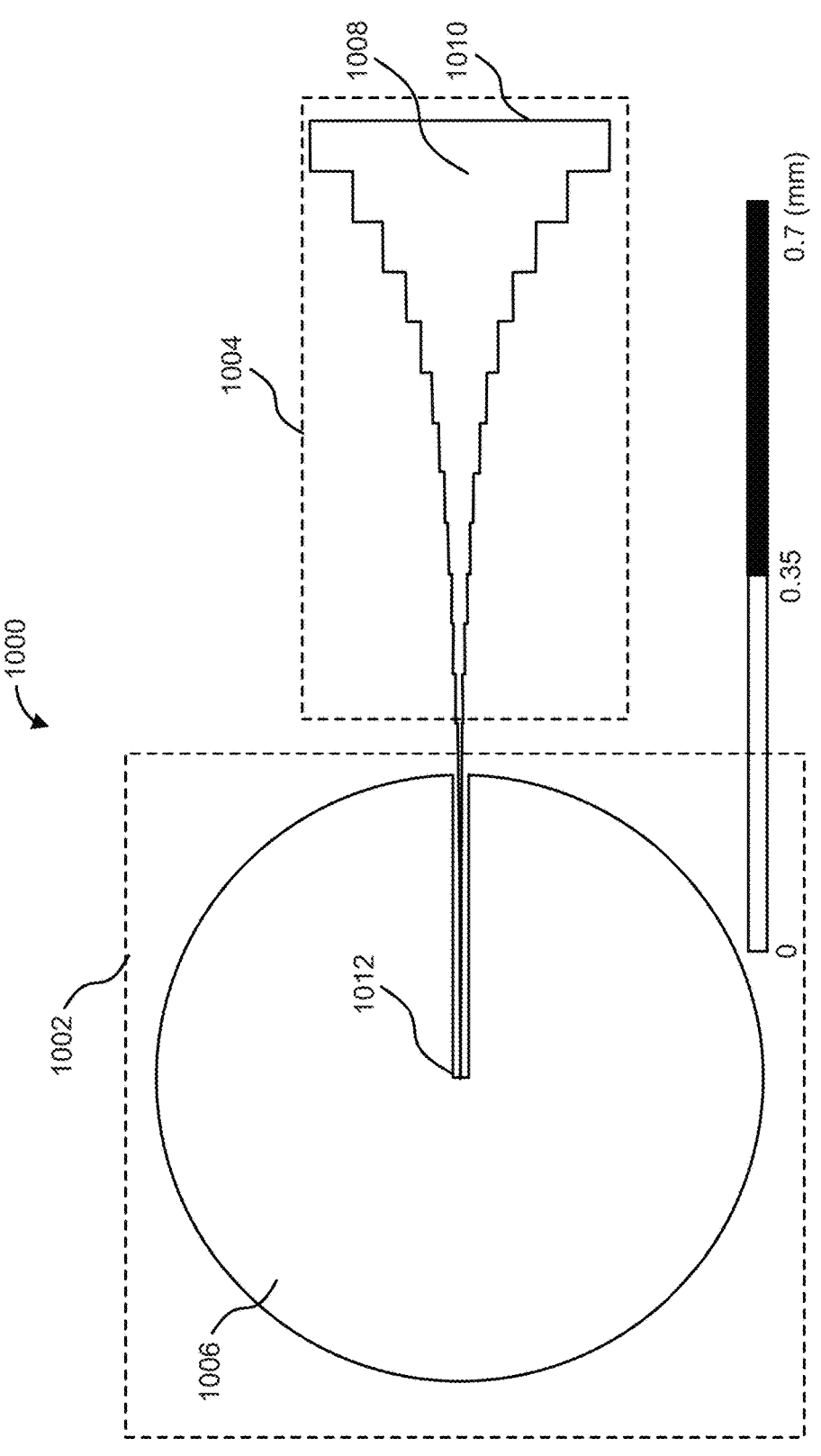
FIG. 10 illustrates yet another example coupling resonator circuit.

FIG. 10 illustrates yet another example coupling resonator circuit 1000. In some examples, the coupling resonator circuit 1000 includes another possible way of implementation of the coupling resonator circuit 200 in FIG. 2. The coupling resonator circuit 1000 includes a capacitive portion 1002 and an inductive portion 1004 that are coupled to one another. The capacitive portion 1002 includes a capacitive plate 1006 having a geometric shape (e.g., a disc shape) and the inductive portion 1004 includes a transmission line 1008. The transmission line 1008 has a first end 1010 (e.g., the end that is wider) and a second end 1012 (e.g., the end that is narrower), and the transmission line 1008 tapers from the first end 1010 in the direction of the second end 1012. In this example, the capacitive portion 1002 and the inductive portion 1004 are coupled to one another by coupling the second end 1012 (e.g., the end that is narrower) of the transmission line 1008 to the capacitive plate 1006.

Figure 11A:
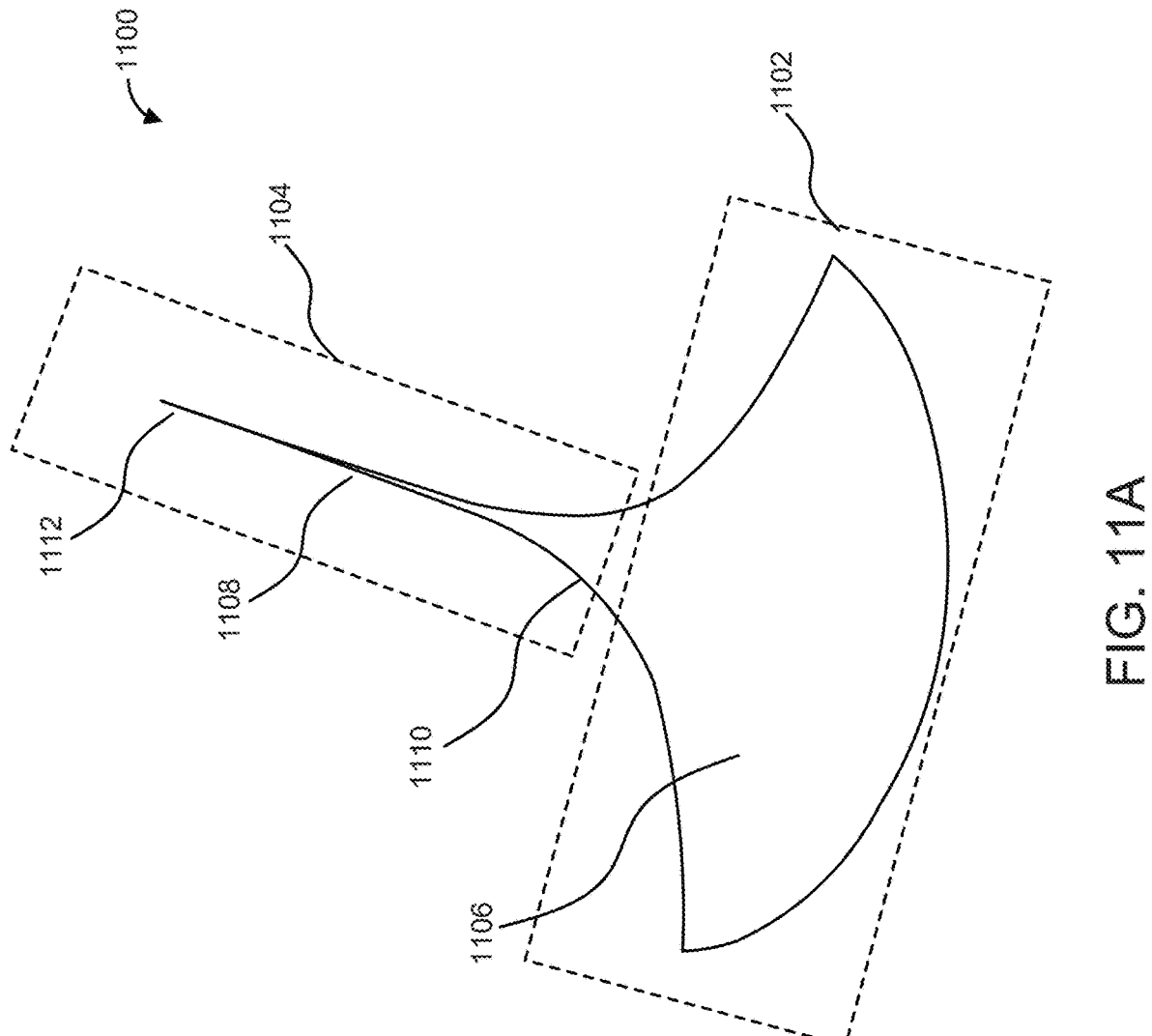
FIG. 11A illustrates another example coupling resonator circuit.

FIG. 11A illustrates another example coupling resonator circuit 1100. In some examples, the coupling resonator circuit 1100 includes another possible way of implementation of the coupling resonator circuit 200 in FIG. 2. The coupling resonator circuit 1100 includes a capacitive portion 1102 and an inductive portion 1104 that are coupled to one another. The capacitive portion 1102 includes a capacitive plate 1106 having a geometric shape (e.g., a pic shape or a ginko leaflike shape) and the inductive portion 1104 includes a transmission line 1108. The transmission line 1108 has a first end 1110 (e.g., the end that is wider) and a second end 1112 (e.g., the end that is narrower), and the transmission line 1108 tapers from the first end 1110 in the direction of the second end 1112. In this example, the capacitive portion 1102 and the inductive portion 1104 are coupled to one another by coupling the first end 1110 (e.g., the end that is wider) of the transmission line 1108 to the capacitive plate 1106.

Figure 11B:
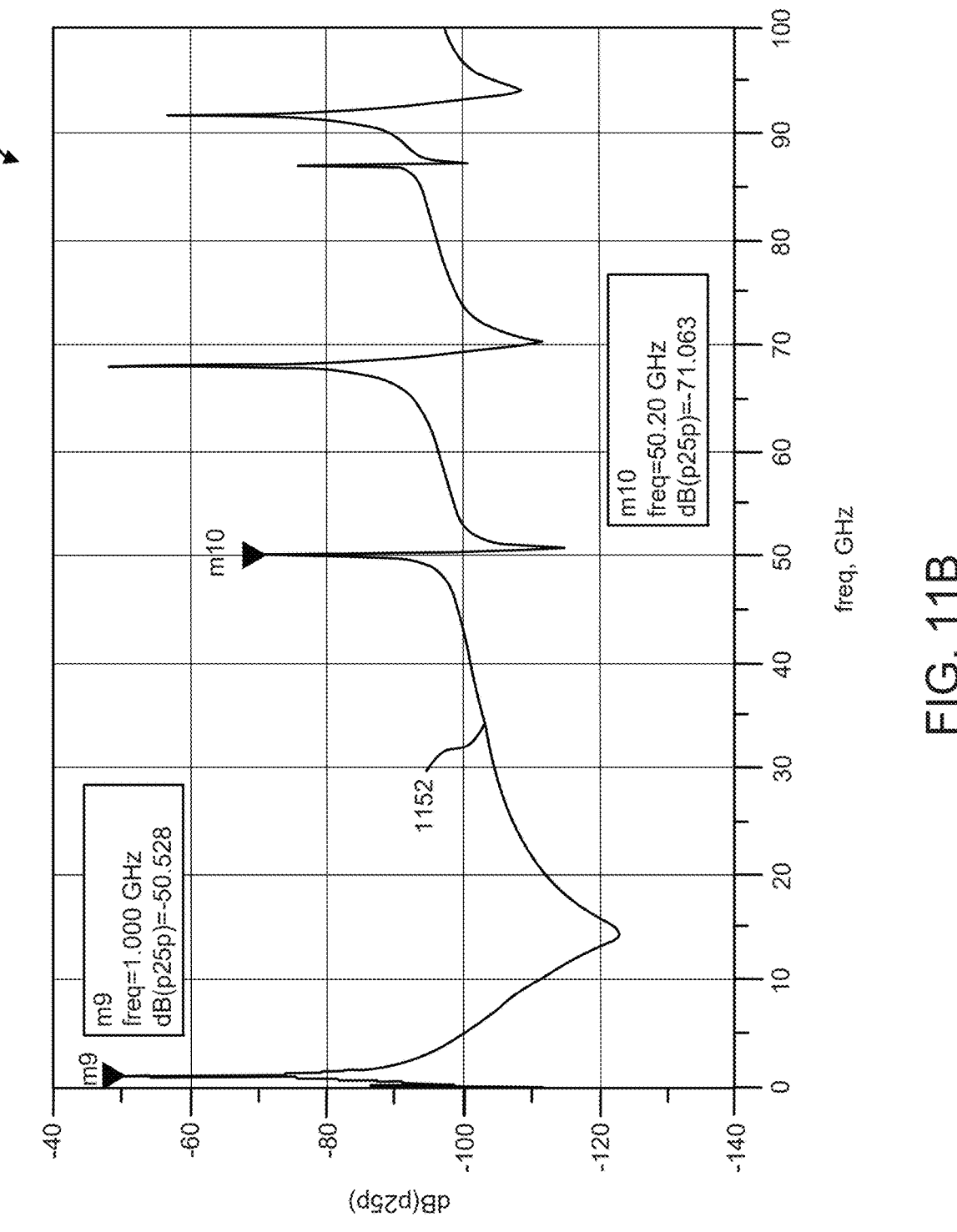
FIG. 11B illustrates a graphical representation that depicts the frequency response of the coupling resonator circuit in FIG. 11A.

FIG. 11B illustrates a graphical representation 1150 that depicts the frequency response of the coupling resonator circuit 1100 in FIG. 11A. The plot 1152 depicts the frequency response of the coupling resonator circuit 1100. As can be seen from the plot 1152, the coupling resonator circuit 1100 has wide separation in frequency (of approximately 50 GHz) between the fundamental frequency (e.g., at m9 which corresponds to approximately 1 GHz) and a first overtone frequency (e.g., at m10 which corresponds to approximately 50 GHz).

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A coupling resonator circuit comprising:
a capacitive portion that includes a capacitive plate having a geometrical shape; and
an inductive portion that is coupled to the capacitive portion, the inductive portion including a transmission line having a first end and a second end, wherein the transmission line tapers from the first end in the direction of the second end such that a width of the transmission line at the first end is greater than a width of the transmission line at the second end;
wherein the coupling resonator circuit is configured to resonate at a desired coupling frequency; and
wherein dimensions of the capacitive portion and the inductive portion determines a separation in frequency between the desired coupling frequency and one or more resonant frequencies that are nearest to the desired coupling frequency.

2. The coupling resonator circuit of claim 1, wherein the desired coupling frequency includes a fundamental frequency, and the one or more resonant frequencies include a first overtone frequency.

3. The coupling resonator circuit of claim 1, wherein the first end of the transmission line is coupled to the capacitive plate.

4. The coupling resonator circuit of claim 1, wherein the second end of the transmission line is coupled to the capacitive plate.

5. The coupling resonator circuit of claim 1, wherein an area of the capacitive portion is greater than an area of the inductive portion.

6. The coupling resonator circuit of claim 1, wherein the capacitive plate includes a perforated capacitive plate including a plurality of perforations on a surface of the capacitive plate.

7. The coupling resonator circuit of claim 1, wherein the transmission line tapers continuously from the first end to the second end.

8. The coupling resonator circuit of claim 1, wherein the transmission line includes a tapered portion that extends from the first end to an intermediate point of the transmission line and a regular portion that extends from the intermediate point of the transmission line to the second end, wherein in the tapered portion, the transmission line tapers continuously from the first end to the intermediate point and in the regular portion, the transmission line has a uniform width from the intermediate point to the second end.

9. The coupling resonator of claim 1, wherein the transmission line is tapered in an exponential manner.

10. The coupling resonator of claim 1, wherein the transmission line is tapered in accordance with a gaussian shape.

11. The coupling resonator of claim 1, further comprising via walls surrounding the capacitive portion and the inductive portion.

12. The coupling resonator circuit of claim 1, wherein the inductive portion includes a plurality of inductive portions, each inductive portion of the plurality of inductive portions including a respective transmission line having a corresponding first end and a corresponding second end, wherein the respective transmission line tapers from the corresponding first end in the direction of the corresponding second end such that a width of the respective transmission line at the corresponding first end is greater than a width of the respective transmission line at the corresponding second end.

13. The coupling resonator circuit of claim 1, wherein the capacitive plate includes one or more capacitive ports configured to couple to one or more superconducting resonator devices, respectively, via capacitive coupling.

14. The coupling resonator circuit of claim 1, wherein the transmission line includes one or more inductive ports configured to couple to one or more superconducting resonator devices, respectively, via galvanic coupling.

15. A superconducting system comprising:

a first superconducting resonator device;

a second superconducting resonator device; and a coupling resonator circuit coupled between the first superconducting resonator device and the second superconducting resonator device, the coupling resonator circuit including:

a capacitive portion that includes a capacitive plate having a geometrical shape; and an inductive portion that is coupled to the capacitive portion, the inductive portion including a transmission line having a first end and a second end, wherein the transmission line tapers from the first end in the direction of the second end such that a width of the transmission line at the first end is greater than a width of the transmission line at the second end;

wherein the coupling resonator circuit is configured to resonate at a desired coupling frequency to facilitate communication between the first superconducting resonator device and the second superconducting resonator device; and wherein dimensions of the capacitive portion and the inductive portion determines a separation in frequency between the desired coupling frequency and one or more resonant frequencies that are nearest to the desired coupling frequency.

16. The superconducting system of claim 15, wherein the first superconducting resonator device is coupled to the capacitive portion of the coupling resonator circuit and the second superconducting resonator device is coupled to the inductive portion of the coupling resonator circuit.

17. The superconducting system of claim 16, wherein the first superconducting resonator device is coupled to the capacitive portion of the coupling resonator circuit via a capacitive port of the capacitive plate by capacitive coupling and the second superconducting resonator device is coupled to the inductive portion of the coupling resonator circuit via an inductive port of the transmission line by galvanic coupling.

18. The superconducting system of claim 17, wherein the capacitive portion of the coupling resonator circuit further includes a coupling capacitor configured to couple the first superconducting resonator device to the capacitive port.

19. The superconducting system of claim 15, wherein both the first superconducting resonator device and the second superconducting resonator device are coupled to the capacitive portion of the coupling resonator circuit.

20. The superconducting system of claim 15, wherein both the first superconducting resonator device and the second superconducting resonator device are coupled to the inductive portion of the coupling resonator circuit.

* * * * *